United States Patent
Migita

(10) Patent No.: US 10,431,727 B2
(45) Date of Patent: Oct. 1, 2019

(54) LIGHT EMITTING APPARATUS

(71) Applicant: SUMITOMO ELECTRIC INDUSTRIES, LTD., Osaka (JP)

(72) Inventor: Masaki Migita, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 15/979,238

(22) Filed: May 14, 2018

(65) Prior Publication Data

US 2018/0337319 A1 Nov. 22, 2018

(30) Foreign Application Priority Data

May 19, 2017 (JP) .................... 2017-099801

(51) Int. Cl.
| | | |
|---|---|---|
| *H01L 35/32* | (2006.01) | |
| *H01L 33/64* | (2010.01) | |
| *H05K 1/02* | (2006.01) | |
| *H01L 35/10* | (2006.01) | |
| *H01S 5/024* | (2006.01) | |
| *H01L 33/36* | (2010.01) | |
| *H05K 1/14* | (2006.01) | |
| *H01S 5/022* | (2006.01) | |
| *H01S 5/00* | (2006.01) | |
| *H01S 5/0683* | (2006.01) | |
| *H01S 5/34* | (2006.01) | |

(52) U.S. Cl.
CPC .............. *H01L 35/32* (2013.01); *H01L 33/36* (2013.01); *H01L 33/644* (2013.01); *H01L 35/10* (2013.01); *H01S 5/02216* (2013.01); *H01S 5/02248* (2013.01); *H01S 5/02415* (2013.01); *H05K 1/0203* (2013.01); *H05K 1/0204* (2013.01); *H05K 1/145* (2013.01); *H01L 33/645* (2013.01); *H01S 5/005* (2013.01); *H01S 5/02276* (2013.01); *H01S 5/02296* (2013.01); *H01S 5/02438* (2013.01); *H01S 5/02476* (2013.01); *H01S 5/0683* (2013.01); *H01S 5/3401* (2013.01); *H05K 2201/042* (2013.01); *H05K 2201/10106* (2013.01); *H05K 2201/10219* (2013.01)

(58) Field of Classification Search
CPC combination set(s) only.
See application file for complete search history.

(56) References Cited

U.S. PATENT DOCUMENTS

| | | | |
|---|---|---|---|
| 2006/0179849 A1* | 8/2006 | Abramov | ............ H01L 23/38 |
| 2017/0087553 A1* | 3/2017 | Zenhausern | ......... G01N 21/645 |
| 2017/0113221 A1* | 4/2017 | Hoffman | ......... G01N 35/00069 |

FOREIGN PATENT DOCUMENTS

JP 2011-086737 4/2011

* cited by examiner

*Primary Examiner* — Zandra V Smith
*Assistant Examiner* — Andre C Stevenson
(74) *Attorney, Agent, or Firm* — Smith, Gambrell & Russell, LLP

(57) ABSTRACT

A light emitting apparatus includes: a module including a Peltier device with a first face opposite a second face, a supporting member with a principal surface, and a light emitting semiconductor device, and a package housing the module. The supporting member principal surface has a first area that supports the first face of the Peltier device, and a second area adjacent to the first area that supports the light emitting semiconductor device. The supporting member has a circuit board with different levels to which the Peltier device and the light emitting semiconductor device are connected.

4 Claims, 5 Drawing Sheets

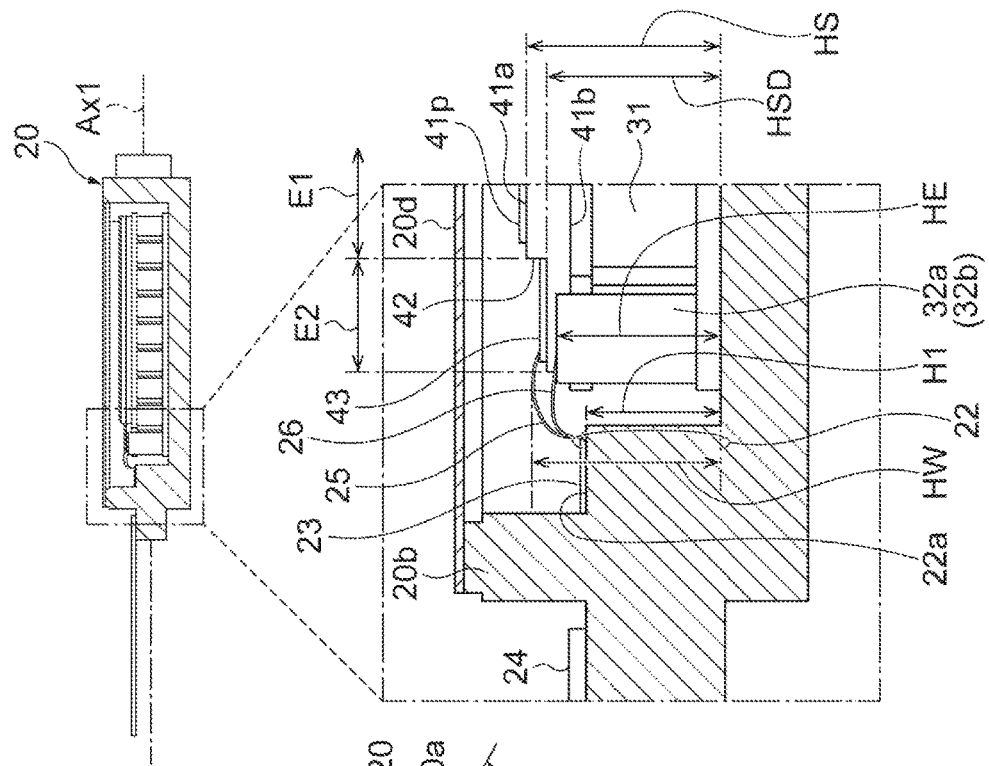
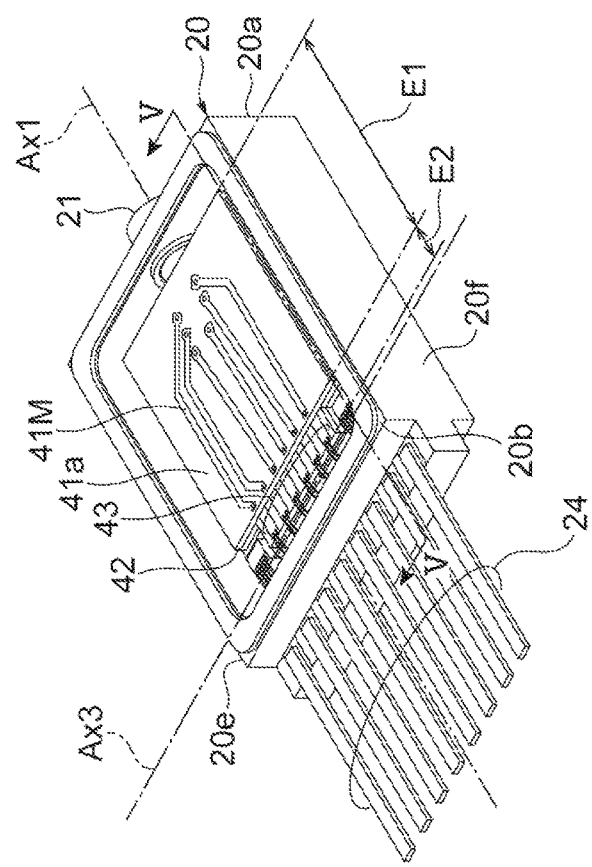

LIGHT EMITTING APPARATUS

BACKGROUND OF THE INVENTION

Field of the Invention

The present invention relates to a light emitting apparatus. This application claims the benefit of priority from Japanese Patent Application No. 2017-099801 filed on May 19, 2017, which is herein incorporated by reference in its entirety.

Related Background Art

Japanese Patent Application Laid-Open Publication No. 2011-86737 (referred to as "Patent Document") discloses a thermoelectric conversion module.

SUMMARY OF THE INVENTION

A light emitting apparatus according to one aspect of the present invention includes: a module including a Peltier device with a first face and a second face, a supporting member with a principal surface, and a light emitting semiconductor device, the first face being opposite to the second face; and a package housing the module, the principal surface having a first area and a second area adjacent to the first area, the supporting member supporting the first face of the Peltier device on the first area of the principal surface, and the supporting member supporting the light emitting semiconductor device on the second area of the principal surface.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 5A is a partially cutaway schematic view showing a light emitting apparatus according to Example 3.

FIG. 5B is a cross-sectional view showing a rear portion of the light emitting apparatus according to Example 3.

DESCRIPTION OF THE EMBODIMENTS

Figure 1:
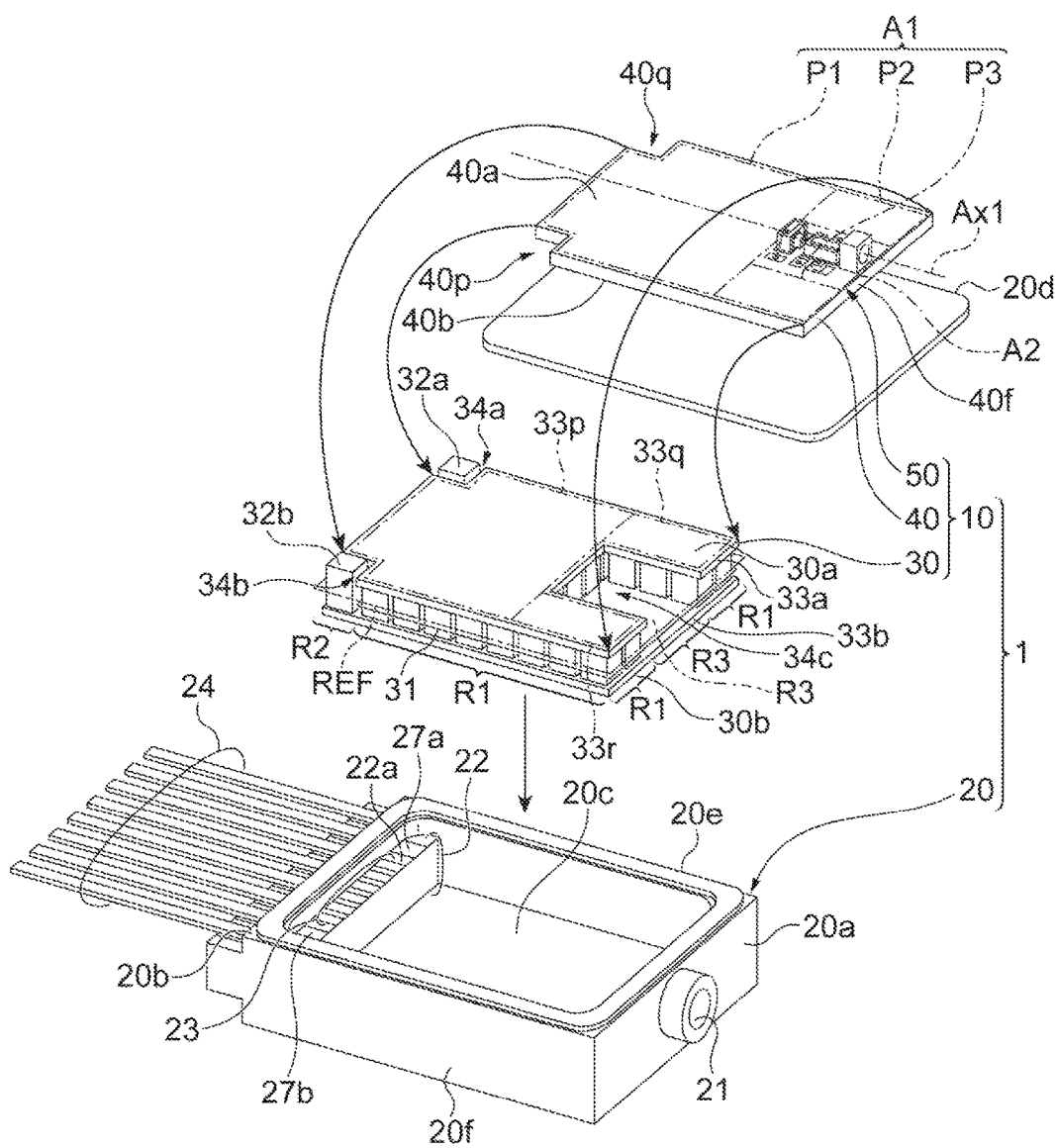
FIG. 1 is an exploded view showing a light emitting apparatus according to the present embodiment.

The thermoelectric conversion module in Patent Document includes an insulating substrate. The insulating substrate mounts a thermoelectric semiconductor device on one area thereof, and an electrode pad on another area thereof. The electrode pad electrically connects the thermoelectric conversion module to an external device. The insulating substrate further mounts, on the other area thereof, a heat sink, a carrier, and a circuit board, and the heat sink mounts a semiconductor laser.

A light emitting apparatus with a package containing a Peltier device having thermoelectric semiconductor elements allows the Peltier device to mount the semiconductor laser. Installing the semiconductor laser in the light emitting apparatus requires the light emitting apparatus to have a cavity having a dimension less than a sum of thicknesses of the Peltier device and the semiconductor laser, and a height of a wiring conductor connecting them with each other.

It is an object of one aspect of the present invention to provide a light emitting apparatus, which includes the semiconductor laser, having a structure that can avoid dimensional increase in a sum of the thickness of the semiconductor laser and the height of an interconnect with the semiconductor laser.

Embodiments according to the above aspect will be described below.

A light emitting apparatus according to an embodiment includes: (a) a module including a Peltier device with a first face and a second face, a supporting member with a principal surface, and a light emitting semiconductor device, the first face being opposite to the second face; and (b) a package housing the module, the principal surface having a first area and a second area adjacent to the first area, the supporting member supporting the first face of the Peltier device on the first area of the principal surface, and the supporting member supporting the light emitting semiconductor device on the second area of the principal surface.

The light emitting apparatus allows the supporting member to mount both the Peltier device and the light emitting semiconductor device on the principal surface thereof. The arrangement of the Peltier device and the light emitting semiconductor device can prevent the light emitting semiconductor device on the supporting member from protruding from the supporting member, which supports the Peltier device.

In the light emitting apparatus according to an embodiment, the package includes a lead terminal and a supporting face supporting the second face of the Peltier device, and the supporting member has a circuit board, the light emitting semiconductor device and the Peltier device are connected to the circuit board, and the circuit board is connected to the lead terminal through a wiring conductor in the package.

The light emitting apparatus allows the package to provide a heat dissipation path with the second face of the Peltier device. The circuit board of the supporting member can connect the light emitting semiconductor device, which is surrounded by the Peltier device, to the lead terminal.

In the light emitting apparatus according to an embodiment, the circuit board includes a multi-layer circuit board having a first face and a second face opposite to the first face, and the first face of the multi-layer circuit board has a first area disposed along a side of the multi-layer circuit board, a second area adjoining the first area, and a difference in level located in a boundary between the first area and the second area, the multi-layer circuit board has a pad electrode on the first area, the light emitting semiconductor device is disposed on the second face of the multi-layer circuit board, and the pad electrode is connected to the lead terminal through a wiring conductor.

The light emitting apparatus allows the multi-layer circuit board to have the pad electrode on the first area, the height of which is lower than that of the second area with respect to the second face of the multi-layer circuit board. The difference in level of the multi-layer circuit board reduces a maximum height of the wiring conductor.

In the light emitting apparatus according to an embodiment, the light emitting semiconductor device is connected to the multi-layer circuit board through a wiring conductor.

The light emitting apparatus arranges both the Peltier device and the light emitting semiconductor device on the second face of the multi-layer circuit board. This arrangement on the second face can prevent the wiring conductor from protruding from the level of the first face of the multi-layer circuit board.

In the light emitting apparatus according to an embodiment, the module has a lens on the second area of the supporting member, and the lens is optically coupled to the light emitting semiconductor device.

The light emitting apparatus has the lens on the second area, and disposing the lens on the second area can prevent the lens from protruding from the supporting member.

In the light emitting apparatus according to an embodiment, the light emitting semiconductor device includes a quantum cascade semiconductor laser.

The light emitting apparatus is provided with a compact optical module which produce a mid-wavelength and long-wavelength infrared light beam.

A light emitting apparatus according to an embodiment includes: (a) a Peltier device; (b) a supporting member supported by the Peltier device; and (c) a light emitting semiconductor device supported by the supporting member, the light emitting semiconductor device and the Peltier device are arranged along a reference plane.

The light emitting apparatus is provided with the Peltier device and the light emitting semiconductor device which are disposed on the principal surface of the supporting member. The Peltier device and the light emitting semiconductor device are arranged along the reference plane. This arrangement can prevent the light emitting semiconductor device on the supporting member, supported by the Peltier device, from protruding with respect to an outer surface of the supporting member.

The teachings of the present invention can be readily understood by considering the following detailed description with reference to the accompanying drawings shown as examples. Referring to the accompanying drawings, embodiments according to the optical module will be illustrated below. When possible, the same portions will be denoted by the same reference numerals.

Figure 2:
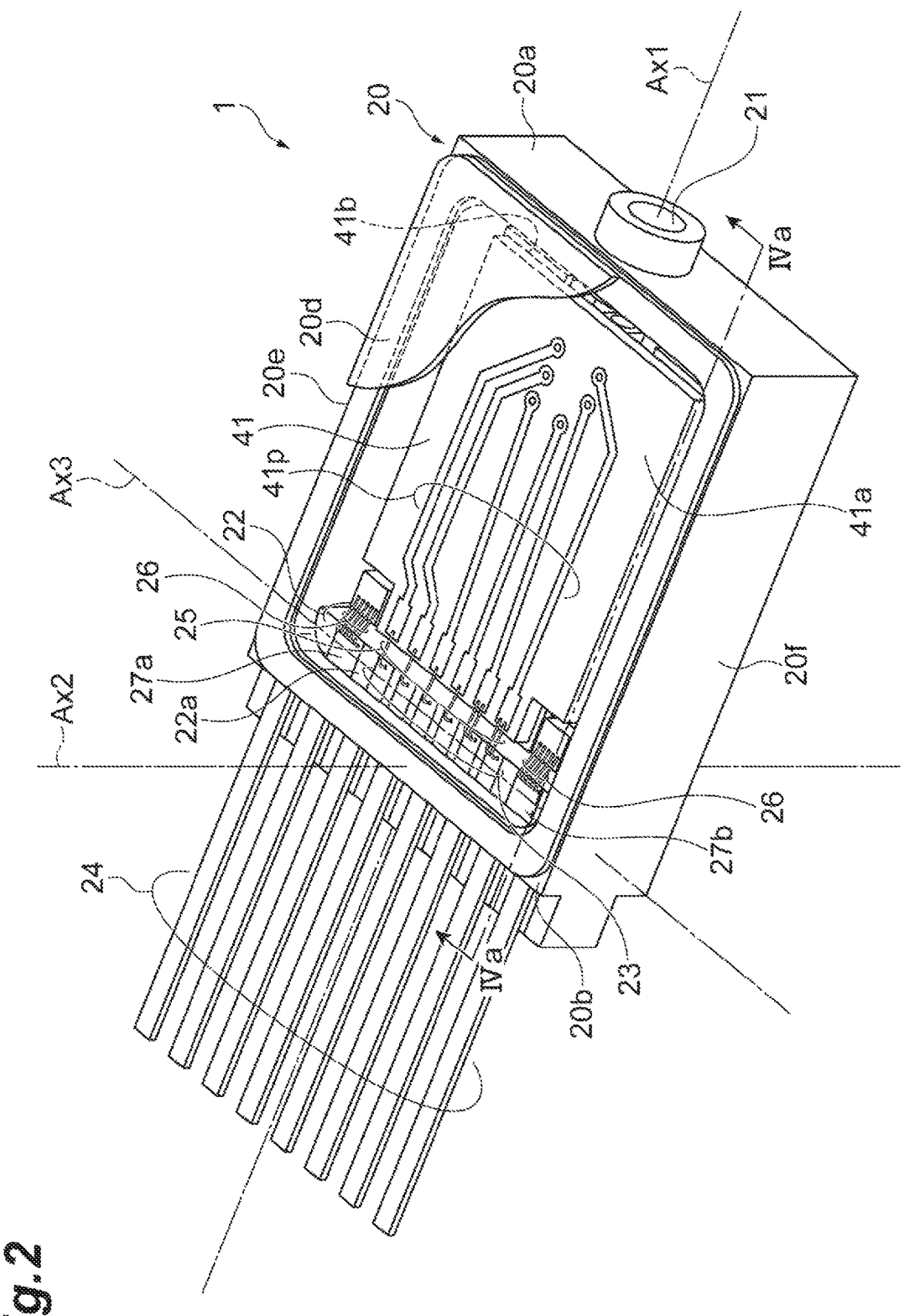
FIG. 2 is a partially cutaway schematic view showing the light emitting apparatus according to the present embodiment.

FIG. 1 is a schematic view showing components of a light emitting apparatus according to the present embodiment. FIG. 2 is a partially cutaway schematic view showing a light emitting apparatus according to the present embodiment. A light emitting apparatus 1 includes a module 10 and a package 20. The package 20 houses the module 10. The module 10 includes a Peltier device 30, a supporting member 40, and a light emitting semiconductor device 50. The Peltier device 30 has a first face 30a and a second face 30b, and the second face 30b is opposite to the first face 30a. The supporting member 40 has a principal surface 40a, and the principal surface 40a includes a first area A1 and a second area A2 different from the first area A1. The supporting member 40 supports the first face 30a of the Peltier device 30 on the first area A1 thereof, and supports the light emitting semiconductor device 50 on the second area A2 thereof.

The light emitting apparatus 1 allows the supporting member 40 to mount both the Peltier device 30 and the light emitting semiconductor device 50 on the principal surface 40a thereof to form their arrangement. This mounting on the same side of the supporting member 40 can prevent the light emitting semiconductor device 50 on the supporting member 40, which supports the Peltier device 30, from protruding with respect to an outer surface of the supporting member 40. Specifically, the Peltier device 30 and the light emitting semiconductor device 50 are arranged on the supporting member 40 along a reference plane REF, which may be parallel to the supporting member 40, in a direction of a first axis Ax1. The light emitting semiconductor device 50 is disposed on the principal surface 40a of the supporting member 40, not on a rear side 40b opposite to the principal surface 40a of the supporting member 40.

The Peltier device 30 includes multiple thermoelectric cooling elements 31, a first electrode 32a and a second electrode 32b for electrical connection, a first supporting board 33a, and a second supporting board 33b. The first and second supporting boards 33a and 33b are arranged in a direction of a second axis Ax2 intersecting the first axis Ax1. The thermoelectric cooling elements 31 are disposed between the first and second supporting boards 33a and 33b, and are arranged along the reference plane REF intersecting the second axis Ax2. The arrangement of the thermoelectric cooling elements 31 causes temperature changes of the first and second supporting boards 33a and 33b. The first supporting board 33a supports the supporting member 40, and the second supporting board 33b is supported by the package. The first supporting board 33a provides the first face 30a of the Peltier device 30, and the second face 30b of the Peltier device 30 provides the second face 30b of the Peltier device 30. The first and the second supporting boards 33a, 33b include, for instance, AlN and $Al_2O_3$. The second supporting board 33b has a first region R1, a second region R2 mounting the first and second electrodes 32a and 32b, and a third region R3 including the remaining area. The third region R3 does not mount any components of the Peltier device 30. The first and second electrodes 32a and 32b are mounted on the second supporting board 33b, and protrude with respect to an upper face of the first supporting board 33a to make electrical connection with the lead terminals in the package easy. The first supporting board 33a has sides with a recess 34a and a recess 34b, each of which is recessed inward of the second supporting board 33b with respect to at least one of the sides, and the recesses 34a and 34b allows the first supporting board 33a to avoid the first and second electrodes 32a and 32b, so that the first supporting board 33a is not in contact with the first and second electrodes 32a and 32b. The first supporting board 33a has the first region R1 that supports the arrangement of the thermoelectric cooling elements 31; has the recesses 34a and 34b with no region supporting the first and second electrodes 32a and 32b; and has an additional recess 34c instead of the third region R3 of the second supporting board 33b. The first supporting board 33a has a main body 33p, and a first arm 33q and a second arm 33r, which form an additional recess 34c. The first and second arms 33q and 33r protrude from the main body 33p in the direction of the first axis. The first electrode 32a has a size and a shape that define the range of the array of the thermoelectric cooling elements 31.

The Peltier device 30 receives an external electric power through the first and second electrodes 32a and 32b. The first and second electrodes 32a and 32b are connected to the thermoelectric cooling elements 31. The thermoelectric cooling elements 31 are fed from an electric power supply to control the temperature of the supporting member 40 by generating or absorbing heat. The change in temperature of the supporting member 40 changes the temperature of the light emitting semiconductor device 50 disposed on the principal surface 40a of the supporting member 40.

In one case, the light emitting semiconductor device 50 generates heat, which propagates in the supporting member 40 from the second area A2 via the second area A1 to the Peltier device 30 on the first area A1 of the supporting member 40 finally. In another case, the Peltier device 30 also provides heat, which propagates in the supporting member 40 from the first area A1 via the second area A2 to the light emitting semiconductor device 50 on the second area A2 of the supporting member 40. The supporting member 40 includes, for instance, AlN, Cu, SiC, CuW, or CuMo.

The second area A2 of the supporting member 40 has a shape with one side, which is disposed at the front edge 40f of the supporting member 40 along the front edge 40f of the supporting member 40. The second area A2 on the front edge 40f allows the light emitting semiconductor device 50 in the second area A2 to emit light outward. The second area A2 adjoins the first area A1 that supports the first face 30a of the Peltier device 30.

In this example, the shapes of the second area A2 has another side opposite to the one side, and the other side of the second area A2 is on the boundary between the first and second areas A1 and A2.

Further, the shape of the second area A2 has additional sides connecting one and the other ends of the one side to and one and the other ends of the other side, respectively. The additional sides are on the boundary between the first and second areas A1 and A2 to widen the heat dissipation pass across the boundary.

In the supporting member 40, the first area A1 of the principal face 40a has a first portion P1. The second area A2 and the first portion P1 of the first area A1 are arranged in the direction of the first axis Ax1. The first portion P1 of the first area A1 adjoins the second area A2. The first area A1 of the principal face 40a further includes a second portion P2 and a third portion P3. The second and third portions P2 and P3 extend in a direction intersecting the direction of the first axis Ax1. The first and second portions P1 and P2 are arranged in the direction of the first axis Ax1, and the first and third portions P1 and P3 are arranged in the direction of the first axis Ax1. The second area A2 is disposed between the second and third portions P2 and P3. In this example, the first, second, and third portions P1, P2 and P3 adjoin the second area A2. The supporting member 40 has a recess 40p and a recess 40q, each of which is recessed inward to the supporting member 40 with respect to at least one of the sides of the supporting member 40, and the recesses 40p and 40q allow the supporting member 40 to avoid the first and second electrodes 32a and 32b, so that the supporting member 40 is isolated from the first and second electrodes 32a and 32b.

The light emitting semiconductor device 50 includes, for instance, a quantum cascade semiconductor laser. The quantum cascade semiconductor laser can generate mid-wavelength and long-wavelength infrared light, and the long-wavelength infrared light has a wavelength longer than that of the mid-wavelength infrared light. Specifically, the quantum cascade semiconductor laser provides a compact optical module, which can generate light with wavelengths of 3 to 11 micrometers.

The package 20 has a space housing the Peltier device 30 and the light emitting semiconductor device 50. Specifically, the package 20 includes a front wall 20a, a rear wall 20b, a bottom board 20c, a ceiling 20d, a first side wall 20e, and a second side wall 20f. The first and the second side walls 20e and 20f are arranged in the direction of the first axis Ax1. The front and rear walls 20a and 20b extend in the direction intersecting that of the first axis Ax1. The first and second side walls 20e and 20f connect one end and the other end of the front wall 20a to one end and the other end of the rear wall 20b, respectively. The bottom board 20c mounts the Peltier device 30, and the Peltier device 30 mounts the supporting member 40. The supporting member 40 supports the light emitting semiconductor device 50, so that the light emitting semiconductor device 50a and the thermoelectric cooling elements 31 are disposed along the reference plane REF, and arranged in the direction of the first axis Ax1.

The front wall 20a has an optical window 21. At least one of the rear wall 20b, the first side wall 20e, or the second side wall 20f has one or more lead terminals. The optical window 21 of the front wall 20a is optically coupled to the light emitting semiconductor device 50. The optical window 21 includes at least one of Ge, ZnSe, ZnS, Si, $CaF_2$, $BaF_2$, sapphire, diamond, or chalcogenide glass. The optical window 21 of the above material is transparent to, for instance, the wavelengths of 3 to 11 micrometers. The bottom board 20c supports the second face 30b of the Peltier device 30. The bottom board 20c provides the second face 30b of the Peltier device 30 with a heat dissipation pass. The bottom board 20c includes AlN, SiC, Cu, CuW, or CuMo. The ceiling 20d includes, for instance, Kovar (trademark) or NiFe alloy.

As shown in FIG. 2, the supporting member 40 may include a circuit board 41, such as a ceramics board, a metal board, and a printed circuit board. The ceramics board includes AN, SiC, sapphire, or $Al_2O_3$. The metal board includes Cu or Al. The printed circuit board includes glass epoxy. The light emitting semiconductor device 50 with the quantum cascade semiconductor laser of a large heat generation includes the circuit board 41 of a base with a high thermal conductivity enabling large heat dissipation, such as a AlN base, SiC base, a sapphire base, or a metal base. The circuit board 41 has a first face 41a and a second face 41b. The circuit board 41 includes a wiring layer 41p extending on the first face 41a, and mounts the light emitting semiconductor device 50 on the second face 41b. The circuit board 41 includes a conductor which is connected to the wiring layer 41p. The wiring layer 41p of the circuit board 41 is connected to the lead terminals 24, and the first and second electrodes 32a and 32b of the Peltier device 30 are connected to the lead terminals 24. If necessary, the circuit board 41 may include a multi-layer printed circuit board.

Figure 3:
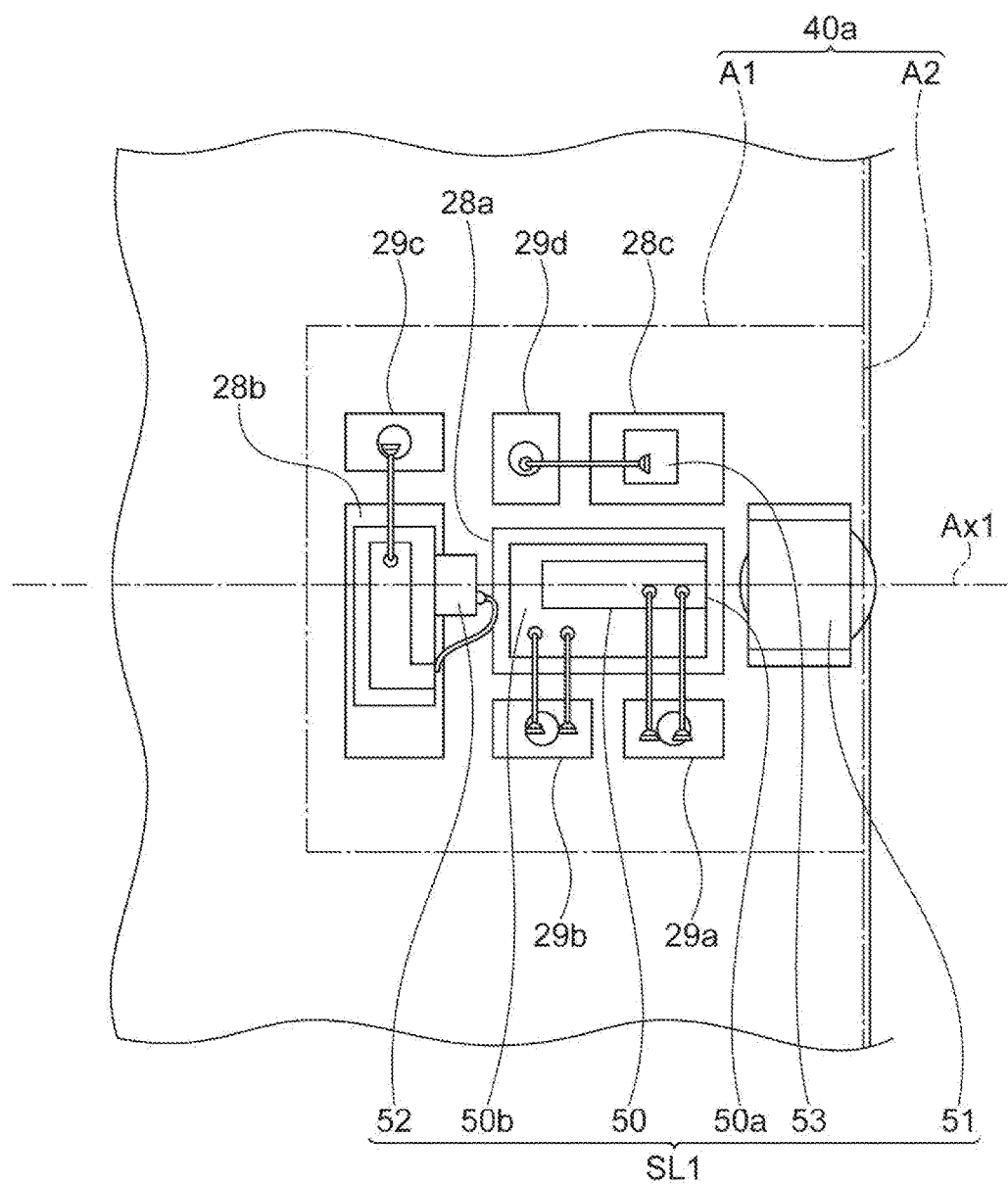
FIG. 3 is an enlarged plan view showing the arrangement of a light emitting semiconductor device, a lens, and a photodetector according to the present embodiment.

FIG. 3 is an enlarged view showing a light emitting subassembly according to the present embodiment. The light emitting subassembly SL1 is disposed in the second area A2 on the principal surface 40a of the supporting member 40. The light emitting subassembly SL1 includes the light emitting semiconductor device 50 and a lens 51, and if necessary, includes a photodetector 52. In this example, the thermoelectric cooling elements 31, the light emitting semiconductor device 50, and the lens 51 are arranged along the reference plane REF. The light emitting semiconductor device 50 has a first end face 50a, which is optically coupled to the lens 51, and a second end face 50b, which is optically coupled to the photodetector 52. The photodetector 52 includes, for instance, a HgCdTe device, an InSb device, a sensor device of an InAs/GaSb superlattice, a thermopile device, or a power collection sensor. The HgCdTe device, the sensor device of the InAs/GaSb superlattice, the thermopile device, and the power collection sensor can detect light with wavelengths of 3 to 15 micrometers, and the InSb device can detect light with wavelengths of 3 to 6 micrometers.

The light emitting subassembly SL1 may further include a temperature sensing device 53, such as a thermistor. The temperature sensing device 53 is mounted in the second area A2, and can monitor a temperature of the light emitting semiconductor device 50.

The light emitting semiconductor device 50 is mounted on a first sub-mount 28a in the second area A2, and is connected to the circuit board 41 through a first circuit post 29a and a second circuit post 29b on the second area A2. The photodetector 52 is mounted on a second sub-mount 28b in the second area A2, and is connected to the circuit board 41 through a third circuit post 29c in the second area A2.

The temperature sensing device 53 is mounted on a third sub-mount 28c in the second area A2, and is connected to the circuit board 41 through a fourth circuit post 29d in the second area A2.

As shown in FIGS. 1 and 2, the rear wall 20b extends on the bottom board 20c in the direction of the second axis Ax2 intersecting the bottom board 20c. The rear wall 20b has a stage 22 inside the package 20. The stage 22 is mounted on the bottom board 20c and protrudes inward in the direction of the first axis Ax1 intersecting the direction of the second axis Ax2. The stage 22 has a top face 22a. The stage 22 has a height associated with that of the lead terminals 24. The rear wall 20b has a first conductor 27a and a second conductor 27b, which are electrically connected with the lead terminals 24, mounted on the top face 22a. The first and second conductors 27a and 27b are connected to the first and second electrodes 32a and 32b of the Peltier device 30, respectively. The rear wall 20b also has multiple third conductors 23 mounted on the top face 22a. The first conductor 27a, the third conductors 23, and the second conductor 27b are arranged on the top face 22a in the direction of a third axis Ax3 intersecting both the first and second axes Ax1 and Ax2. The circuit board 41 is connected to the third conductors 23, which is connected to the lead terminal 24 of the rear wall 20b. These interconnects connect the Peltier device 30 and the light emitting semiconductor device 50 to the lead terminals 24.

As shown in FIGS. 1 to 3, the light emitting apparatus 1 has the light emitting semiconductor device 50 supported by the supporting member 40, and the supporting member 40 supported by the Peltier device 30. The Peltier device 30 and the light emitting semiconductor device 50 are arranged along the reference plane REF. Specifically, the Peltier device 30 has the first supporting board 33a, the second supporting board 33b, and the thermoelectric cooling elements 31. The thermoelectric cooling elements 31 are disposed between the first and second supporting boards 33a and 33b. The thermoelectric cooling elements 31 and the light emitting semiconductor device 50 are arranged along the reference plane REF. The light emitting apparatus 1 is provided with the Peltier device 30 and the light emitting semiconductor device 50 which are arranged on the principal surface of the supporting member 40. This arrangement can provide the array of thermoelectric cooling elements 31 and the light emitting semiconductor device 50 along the reference plane REF. The arrangement can prevent the light emitting semiconductor device 50 on the supporting member 40 supporting the Peltier device 30 from protruding with respect to the supporting member 40.

A description will be given of three examples of the light emitting apparatus 1. These examples provides variations of an electrical connection between the circuit board 41 and the lead terminal 24 of the package 20 in the light emitting apparatus shown in FIGS. 1 to 3.

EXAMPLE 1

Figure 4A:
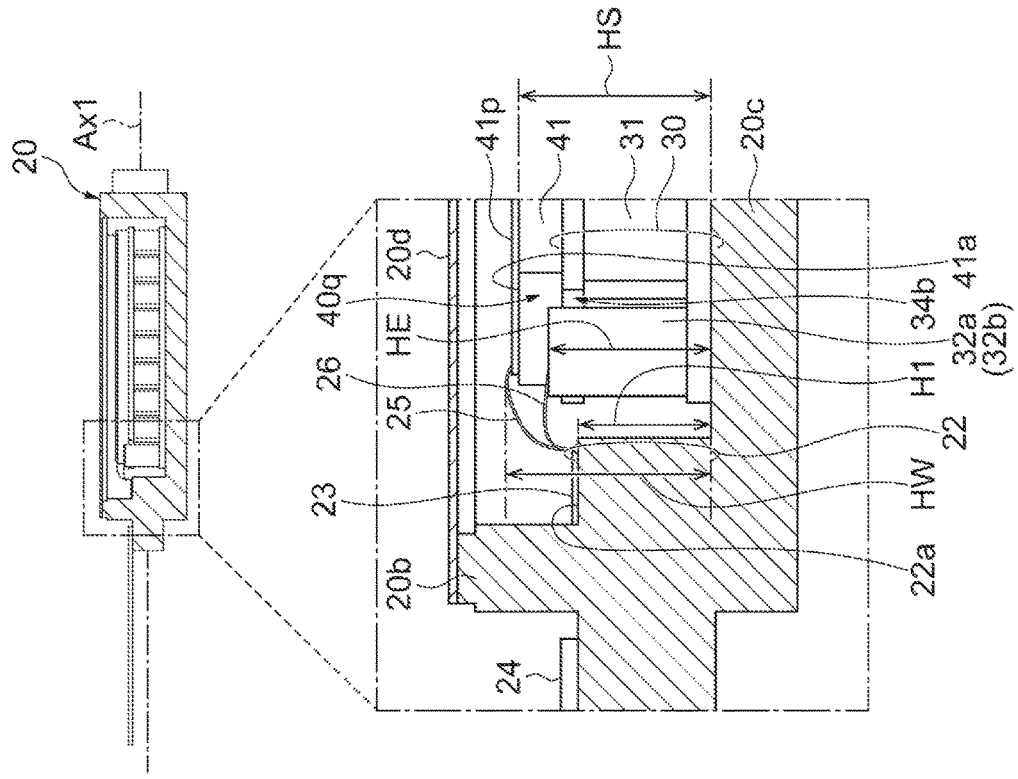
FIG. 4A is a cross-sectional view, taken along a line equivalent to line IVa-IVa shown in FIG. 2, showing a light emitting apparatus according to Example 1.

FIG. 4A is a cross-sectional view, taken along a line equivalent to line IVa-IVa shown in FIG. 2, showing a light emitting apparatus according to Example 1. The top face 22a of the stage 22 has a first height H1, which is defined as a distance from the bottom board 20c of the package 20 to the top face 22a. The first face 41a of the circuit board 41 has a second height HS, which is defined as a distance from the bottom board 20c of the package 20 to the top face 22a to the first face 41a. The first electrode 32a (the second electrode 32b) has a third height HE, which is defined as a distance from the bottom board 20c of the package 20 to the top face 22a. The first top face 22a of the stage 22 is aligned with the first face 41a of the circuit board 41 in terms of height.

The circuit board 41 is connected to the third conductors 23 with wiring conductors 25, and the third conductors 23 is connected to the lead terminals 24. The first and second electrodes 32a and 32b are connected to the first and second conductors 27a and 27b with wiring conductors 26, respectively. The first and second electrodes 32a and 32b are connected to the lead terminals 24 through the first and second conductors 27a and 27b, respectively. The adjustment of the first top face 22a of the stage 22 in terms of height allows the largest heights of the wiring conductors 25 and 26 (the maximum height of the wiring conductors 25 and 26 which is defined with respect to the level of the bottom board 20c of the package 20) to be slightly larger than the heights of the first top face 22a and the first face 41a of the circuit board 41.

EXAMPLE 2

Figure 4B:
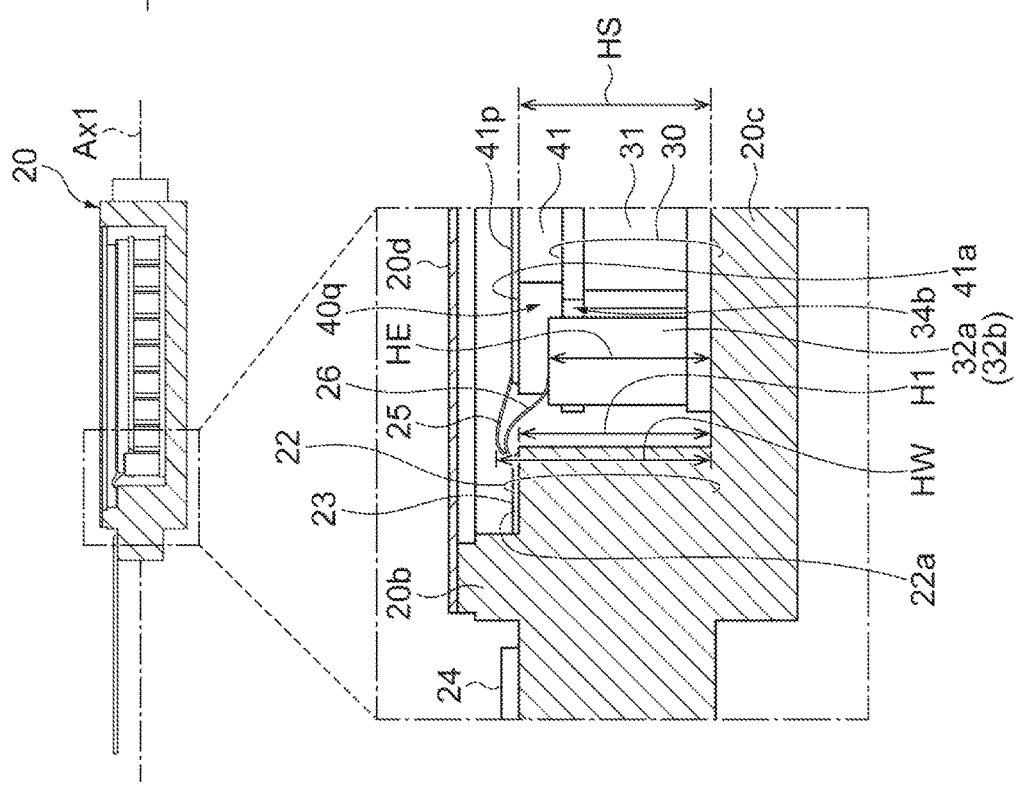
FIG. 4B is a cross-sectional view, taken along a line equivalent to line IVa-IVa shown in FIG. 2, showing a light emitting apparatus according to Example 2.

FIG. 4B is a cross-sectional view, taken along a line equivalent to line IVa-IVa shown in FIG. 2, showing a light emitting apparatus according to Example 2. The first height H1 of the first top face 22a of the stage 22 is lower than the second height HS of the first face 41a of the circuit board 41, and is lower than the third height HE of the first electrode 32a (the second electrode 32b). Making the first top face 22a of the stage 22 low in height allows the largest heights of the wiring conductors 25 and 26 (the maximum height of the wiring conductors which is defined with respect to the level of the bottom board 20c of the package 20) to be slightly larger than the height of the first face 41a of the circuit board 41.

EXAMPLE 3

FIGS. 5A and 5B are schematic views each showing a light emitting apparatus according to Example 3. FIG. 5B is a cross-sectional view, taken along line V-V shown in FIG. 5A. The circuit board 41 includes a multi-layer printed circuit board 41M. The multi-layer printed circuit board 41M includes a first region E1 and a second region E2 adjoining the first region E1. The first and second regions E1 and E2 are arranged in the direction of the first axis Ax1. The multi-layer printed circuit board 41M has the difference in level 42 is located at a boundary between the first and second regions E1 and E2. The difference in level 42 extends in the direction of the third axis Ax3. The light emitting semiconductor device 50 is disposed on the first region E1. The circuit board 41 has multiple conductive layers 43. The conductive layers 43 are connected to the wiring layers 41p in the circuit board 41. The second region E2 of the multi-layer circuit board 41M has a fourth height HSD, which is defined as a distance from the bottom board 20c of the package 20 to the second region E2. The fourth height HSD is smaller than the second height HS of the first region E1. The first height H1 of the first top face 22a of the stage 22 is smaller than the second height HS of the first region E1 and the fourth height HSD of the second region E2. The multi-layer circuit board 41M has a difference in level allowing the largest height of the wiring conductors 25 and 26 (the maximum height of the wiring conductors which is defined with respect to the level of the bottom board 20c of the package 20) to be lower than the height of the first face 41a of the circuit board 41.

The light emitting apparatus according to the above-described embodiment is provided with a structure which can avoid dimensional increase in an assembly including the Peltier device and the semiconductor laser mounted thereon.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A light emitting apparatus comprising:
   a module including a Peltier device with a first face and a second face, a supporting member with a principal surface, and a light emitting semiconductor device, the first face being opposite to the second face; and
   a package housing the module, the package including a lead terminal and a supporting face supporting the second face of the Peltier device, wherein
   the principal surface of the supporting member has a first area and a second area adjacent to the first area,
   the supporting member supports the first face of the Peltier device on the first area of the principal surface thereof,
   the supporting member supports the light emitting semiconductor device on the second area of the principal surface thereof,
   the supporting member has a circuit board to, which the light emitting semiconductor device and Peltier device are connected, the circuit board being connected to the lead terminal through a wiring conductor in the package,
   the circuit board includes a multi-laver circuit board having a first face and a second face opposite to the first face thereof, the first face of the multi layer circuit having a first area disposed along a side of the multi-layer circuit board, a second area adjoining the first area, and a difference in level at a boundary between the first area and the second area, the second face of the multi-layer circuit board having the light emitting semiconductor device disposed thereon, and
   the multi -layer circuit board first face has a pad electrode on the first area thereof, the pad electrode being connected to the lead terminal through a wiring conductor.

2. The light emitting apparatus according to claim 1, wherein the light emitting semiconductor device is connected to the multi-layer circuit board through a wiring conductor.

3. The light emitting apparatus according to claim 1, wherein the module has a lens on the second area of the first face of the supporting member, the lens being optically coupled to the light emitting semiconductor device.

4. The light emitting apparatus according to claim 1, wherein the light emitting semiconductor device includes a quantum cascade semiconductor laser.

* * * * *